(12) United States Patent
Sameshima et al.

(10) Patent No.: US 8,979,249 B2
(45) Date of Patent: Mar. 17, 2015

(54) PIEZOELECTRIC ACTUATOR AND INK-JET HEAD INCLUDING SAME

(75) Inventors: Kouichi Sameshima, Kyoto (JP); Kusunoki Higashino, Osaka (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/112,825

(22) PCT Filed: Mar. 30, 2012

(86) PCT No.: PCT/JP2012/058541
§ 371 (c)(1),
(2), (4) Date: Oct. 18, 2013

(87) PCT Pub. No.: WO2012/144305
PCT Pub. Date: Oct. 26, 2012

(65) Prior Publication Data
US 2014/0028760 A1    Jan. 30, 2014

(30) Foreign Application Priority Data

Apr. 18, 2011  (JP) ................. 2011-091690

(51) Int. Cl.
*B41J 2/045* (2006.01)
*B41J 2/14* (2006.01)
(Continued)

(52) U.S. Cl.
CPC .............. *B41J 2/045* (2013.01); *B41J 2/14233* (2013.01); *H01L 41/047* (2013.01); *H01L 41/0973* (2013.01); *H01L 41/29* (2013.01); *H01L 41/08* (2013.01); *H01L 41/332* (2013.01)
USPC ....................................................... 347/71

(58) Field of Classification Search
CPC ...... B41J 2/1404; B41J 2/1631; B41J 2/1603; B41J 2002/14387; B41J 2/1623; B41J 2/175; B41J 2/17596; B41J 2/17509; B41J 2/17513; B41J 2/17553; B41J 2/1752; B41J 2/17523; B41J 2/17566
USPC ................................................. 347/65, 85, 86
See application file for complete search history.

(56) References Cited

U.S. PATENT DOCUMENTS

2006/0033595 A1    2/2006  Nagao et al.
2007/0035590 A1    2/2007  Sumi
(Continued)

FOREIGN PATENT DOCUMENTS

CN    101645699    2/2010
JP    8-274573    10/1996
(Continued)

OTHER PUBLICATIONS

Office Action (and an English translation thereof) dated Mar. 4, 2014 issued in the corresponding Japanese Patent Application No. 2013-510928.

*Primary Examiner* — Lisa M Solomon
(74) *Attorney, Agent, or Firm* — Cozen O'Connor

(57) ABSTRACT

In a piezoelectric actuator (1) that vibrates a diaphragm (12) provided on a pressure chamber (21) formed in a substrate (11) toward the pressure chamber (21), a lower electrode (13), a piezoelectric member (14) and an upper electrode (15) sequentially stacked on the diaphragm (12) are provided, on a part of the piezoelectric member (14) above the side wall of the pressure chamber (21), an upper electrode drawing portion (15a) drawn out from the upper electrode (15) above the pressure chamber (21) is formed and under the upper electrode drawing portion (15a), the piezoelectric member (14) is separated by a gap portion (S) above a boundary surface between the side wall (21a) of the pressure chamber (21) and the pressure chamber (21) in the substrate (11).

11 Claims, 12 Drawing Sheets

(51) Int. Cl.
*H01L 41/047* (2006.01)
*H01L 41/09* (2006.01)
*H01L 41/29* (2013.01)
*H01L 41/08* (2006.01)
*H01L 41/332* (2013.01)

(56) References Cited

U.S. PATENT DOCUMENTS

2008/0259133 A1  10/2008  Hara et al.
2009/0193635 A1  8/2009  Sugahara
2009/0244213 A1  10/2009  Shimada
2010/0033063 A1  2/2010  Nishihara et al.
2013/0193809 A1  8/2013  Araki

FOREIGN PATENT DOCUMENTS

| JP | 2001-096747 | 4/2001 |
| JP | 2006-314007 | 11/2006 |
| JP | 2008-211965 | 9/2008 |
| JP | 2008-227144 | 9/2008 |
| JP | 2009-182195 | 8/2009 |
| JP | 2010-045437 | 2/2010 |
| WO | WO 2005/060091 | 6/2005 |
| WO | WO 2011/142232 | 4/2011 |
| WO | WO 2011/099381 | 8/2011 |

PIEZOELECTRIC ACTUATOR AND INK-JET HEAD INCLUDING SAME

RELATED APPLICATIONS

This is a U.S. national stage of International application No. PCT/JP2011/058541 filed on Mar. 30, 2012.

This patent application claims the priority of Japanese application no. 2011-091690 filed Apr. 18, 2011 the disclosure content of which is hereby incorporated by reference.

TECHNICAL FIELD

The present invention relates to a piezoelectric actuator as an electro-mechanical conversion element, and an ink-jet head including such a piezoelectric actuator.

BACKGROUND ART

In recent years, ink-jet printers have become rapidly widespread due to high-speed printing, low noise, high-definition printing, low cost and the like. In the ink-jet printer, an ink-jet head that discharges an appropriate amount of ink is provided. As the ink-jet head, for example, an ink-jet head is disclosed in patent document 1.

In the ink-jet head of patent document 1, a pressure chamber is formed in a substrate, and a diaphragm is formed on the substrate so as to cover the pressure chamber. On the diaphragm, a lower electrode, a piezoelectric member and an upper electrode are formed in this order. In this configuration, when voltage is applied to the upper electrode and the lower electrode, the expansion and contraction of the piezoelectric member cause piezoelectric distortion (piezoelectric displacement), and the diaphragm is bent and deformed. The bending and deformation of the diaphragm cause the pressure within the pressure chamber to be increased, and thus ink droplets are discharged from a nozzle.

Here, the upper electrode is drawn out together with the piezoelectric member from an area above the pressure chamber to an area above the side wall of the pressure chamber, and thus it is possible to energize the upper electrode above the pressure chamber. Moreover, the upper electrode is drawn out together with the piezoelectric member, and thus it is possible to easily draw out the upper electrode. The reason for this is as follows.

For example, when only the upper electrode is drawn out from the area above the pressure chamber, one way is to draw out the upper electrode from the upper surface of the piezoelectric member in the area above the pressure chamber closely along the side surface of the piezoelectric member. However, since the side surface of the piezoelectric member is substantially perpendicular to the upper surface, especially when the thickness of the piezoelectric member is large, it is difficult to adhere the metal material that is to be the upper electrode to the side surface of the piezoelectric member by evaporation or sputtering, with the result that it is difficult to draw the upper electrode over the step of the thickness of the piezoelectric member. On the other hand, in the configuration in which the upper electrode is drawn out together with the piezoelectric member, since the upper electrode is preferably formed only on the upper surface of the piezoelectric member, it is easy to form the upper electrode by evaporation or the like. In other words, since it is not necessary to form such an upper electrode as to extend over the step of the thickness of the piezoelectric member, it is easy to draw out the upper electrode.

However, as described above, in the configuration in which the upper electrode is drawn out together with the piezoelectric member, since the piezoelectric member is continuous over the area above the pressure chamber and the area above the side wall of the pressure chamber, as the piezoelectric member above the pressure chamber expands and contracts, a bending load is applied onto the vicinity of the boundary between the piezoelectric member above the pressure chamber and the piezoelectric member above the side wall of the pressure chamber, that is, the portion of the piezoelectric member located above the side wall surface of the pressure chamber, with the result that stress is concentrated in this portion. Hence, a crack is produced in the vicinity of the boundary in the piezoelectric member, and this causes the upper electrode to be broken. Since the piezoelectric displacement of the piezoelectric member above the pressure chamber is suppressed by the piezoelectric member above the side wall of the pressure chamber, it is impossible to avoid a decrease in piezoelectric displacement.

In this respect, in the ink-jet head of patent document 2, a space portion is provided between a diaphragm and a piezoelectric member in an area above the boundary surface between a pressure chamber and the side wall of the pressure chamber, and the piezoelectric member and an upper electrode are drawn out over the space portion. In this way, the stress concentration in the area above the boundary surface is avoided, and thus the upper electrode is prevented from being broken.

RELATED ART DOCUMENT

Patent Document

Patent document 1: JP-A-2009-182195 (see FIG. 4 and the like)

Patent document 2: JP-A-2001-96747 (see claim 1, paragraph [0010], FIG. 2 and the like)

DISCLOSURE OF THE INVENTION

Problems to be Solved by the Invention

However, although in patent document 2, the piezoelectric member is provided over the space portion, and thus the upper electrode is prevented from being broken, since the piezoelectric member above the pressure chamber and the piezoelectric member above the side wall of the pressure chamber are continuous, the piezoelectric displacement of the piezoelectric member above the pressure chamber is not a little suppressed by the piezoelectric member above the side wall of the pressure chamber, with the result that as in patent document 1, it is impossible to avoid a decrease in piezoelectric displacement.

The present invention is made to solve the foregoing problem. An object of the present invention is to provide: a piezoelectric actuator that can avoid a decrease in piezoelectric displacement, that prevents an upper electrode from being broken by a crack in a piezoelectric member and in which the upper electrode can easily be drawn out even when the thickness of the piezoelectric member is large; and an ink-jet head that includes such a piezoelectric actuator.

Means for Solving the Problem

According to one configuration of the present invention, there is provided a piezoelectric actuator that deforms a diaphragm provided on a pressure chamber formed in a substrate toward the pressure chamber, where, in a state where the diaphragm is located on the pressure chamber, a lower electrode, a piezoelectric member and an upper electrode are sequentially stacked on the diaphragm, on a part of the piezoelectric member above a side wall of the pressure chamber, an upper electrode drawing portion drawn out from the upper electrode above the pressure chamber is formed and under the upper electrode drawing portion, the piezoelectric member is separated by a gap portion above a boundary surface between the side wall of the pressure chamber and the pressure chamber in the substrate.

On the substrate, the diaphragm is formed so as to cover an upper portion of the pressure chamber; on the diaphragm; the lower electrode, the piezoelectric member and the upper electrode are sequentially formed. Voltage is applied to the upper electrode and the lower electrode, and thus the piezoelectric member above the pressure chamber is expanded and contracted, and the diaphragm on the pressure chamber is vibrated. Thus, by the vibration of the diaphragm, it is possible to discharge gas or liquid from the pressure chamber; in this case, the piezoelectric actuator can be used as a pump. By contrast, an electric field produced by the vibration of the diaphragm is detected, and thus the piezoelectric actuator can be used as a sensor.

Here, on the part of the piezoelectric member above the side wall of the pressure chamber, the upper electrode drawing portion drawn out from the upper electrode above the pressure chamber is formed, and under the upper electrode drawing portion, the piezoelectric member is separated by the gap portion above the boundary surface between the side wall of the pressure chamber and the pressure chamber in the substrate. In this way, the piezoelectric member above the side wall of the pressure chamber is prevented from suppressing the displacement of the piezoelectric member above the pressure chamber, and it is possible to avoid a decrease in piezoelectric displacement. In the portion where a crack is most likely to be produced by stress concentration, the piezoelectric member is not present but the gap portion is present, and thus it is also possible to prevent the upper electrode (in particular, the upper electrode drawing portion) from being broken by a crack in the piezoelectric member. This configuration can easily be realized by, for example, forming an electrode layer that is to be the upper electrode and the upper electrode drawing portion on the piezoelectric member, and then removing the piezoelectric member that is to be the gap portion by side etching when patterning is performed on the piezoelectric member. Hence, as compared with the conventional case where the upper electrode is drawn out from the upper surface of the piezoelectric member closely along the side surface, even if the thickness of the piezoelectric member is large, it is possible to easily and reliably draw out the upper electrode.

In the piezoelectric actuator according to the one configuration of the present invention, the width of the upper electrode drawing portion on the gap portion may be twice or less the amount of side etching when the piezoelectric member is subjected to patterning.

In this case, even after the electrode layer that is to be the upper electrode and the upper electrode drawing portion is formed on the piezoelectric member, it is possible to reliably remove the piezoelectric member (the piezoelectric member located in the gap portion) under the upper electrode drawing portion by side etching, and to reliably realize the configuration where the upper electrode drawing portion is formed over the gap portion.

The upper electrode drawing portion on the gap portion may be formed to be bent within a plane parallel to the stacking surface of the upper electrode.

In this configuration, the upper electrode drawing portion on the gap portion contracts when the piezoelectric member above the pressure chamber expands, and expands when the piezoelectric member contracts. In this way, it is possible to suppress stress (contraction stress at the time of the expansion, tensile stress at the time of the contraction) by the expansion and contraction of the piezoelectric member, and to reliably prevent the upper electrode drawing portion from being broken by the expansion and contraction of the piezoelectric member. By contrast, since it is possible to reduce the load by the upper electrode drawing portion on the piezoelectric member above the pressure chamber, it is possible to reliably avoid a decrease in piezoelectric displacement.

The upper electrode drawing portion on the gap portion may be formed to be bent into the gap portion in an initial state before displacement of the piezoelectric member.

In this configuration, when the piezoelectric member above the pressure chamber expands, the upper electrode drawing portion is further bent by the contraction stress whereas, when the piezoelectric member contracts, the amount of bending of the upper electrode drawing portion is reduced by the tensile stress. In either case, since the stress caused by the expansion and contraction of the piezoelectric member above the pressure chamber is suppressed by the upper electrode drawing portion, it is possible to further reliably prevent the upper electrode drawing portion from being broken by the expansion and contraction of the piezoelectric member.

Preferably, the piezoelectric member is separated by the gap portion into a first piezoelectric member located above the pressure chamber and a second piezoelectric member formed above the side wall of the pressure chamber so as to surround the first piezoelectric member, and the upper electrode drawing portion is formed by drawing out the upper electrode above the pressure chamber from positions symmetric with respect to a center of the pressure chamber over the gap portion in directions opposite to each other.

In this configuration, the direction in which the diaphragm is vibrated by the expansion and contraction of the first piezoelectric member can be brought close to a direction perpendicular to the surface of the substrate, and thus the characteristic of the piezoelectric actuator serving as the actuator is enhanced. In particular, when the piezoelectric actuator configured as described above is applied to, for example, the transmission and reception element of an ultrasonic probe, it is possible to emit ultrasonic waves in the form of uniform spherical waves, with the result that the performance of the element can be enhanced.

Preferably, when in the upper electrode above the pressure chamber, end portions on sides opposite to each other are a first end portion and a second end portion, respectively, the upper electrode drawing portion is drawn from the first end portion of the upper electrode above the pressure chamber through an outside of the piezoelectric member above the pressure chamber to a side of the second end portion, is then further extended in a direction opposite to the first end portion and is drawn out onto the piezoelectric member above the side wall of the pressure chamber.

In this configuration, as compared with the configuration in which the upper electrode drawing portion is linearly drawn out from the upper electrode above the pressure chamber, it is possible to obtain an extra length of the upper electrode drawing portion outside the piezoelectric member above the pressure chamber, that is, on the region where the piezoelectric member is not present. In this way, it is possible to suppress the approximately same stress even if the distance between the piezoelectric member above the pressure chamber and the piezoelectric member above the side wall of the pressure chamber is reduced as compared with the configuration where the upper electrode drawing portion is linearly drawn out. Thus, it is possible to suppress, while reducing the size of the actuator, the stress of the upper electrode drawing portion and prevent the breakage of the upper electrode drawing portion.

An ink-jet head according to another configuration of the present invention may include: the piezoelectric actuator configured as described above; and a nozzle plate that includes a discharge outlet for an ink with which the pressure chamber of the piezoelectric actuator is filled.

In this configuration, by avoiding a decrease in piezoelectric displacement and preventing the breakage of the upper electrode drawing portion, it is possible to reduce the power consumption of and increase the life of the ink-jet head.

Advantages of the Invention

In the configuration described above, the piezoelectric member is separated by the gap portion, and thus the piezoelectric member above the side wall of the pressure chamber is prevented from suppressing the displacement of the piezoelectric member above the pressure chamber. Thus, it is possible to avoid a decrease in piezoelectric displacement. In the portion where a crack is most likely to be produced by stress concentration, the piezoelectric member is not present, and thus it is also possible to prevent the upper electrode drawing portion from being broken by a crack in the piezoelectric member.

BEST MODE FOR CARRYING OUT THE INVENTION

An embodiment of the present invention will be described below with reference to accompanying drawings.

Configuration of a Piezoelectric Actuator

Figure 1A:
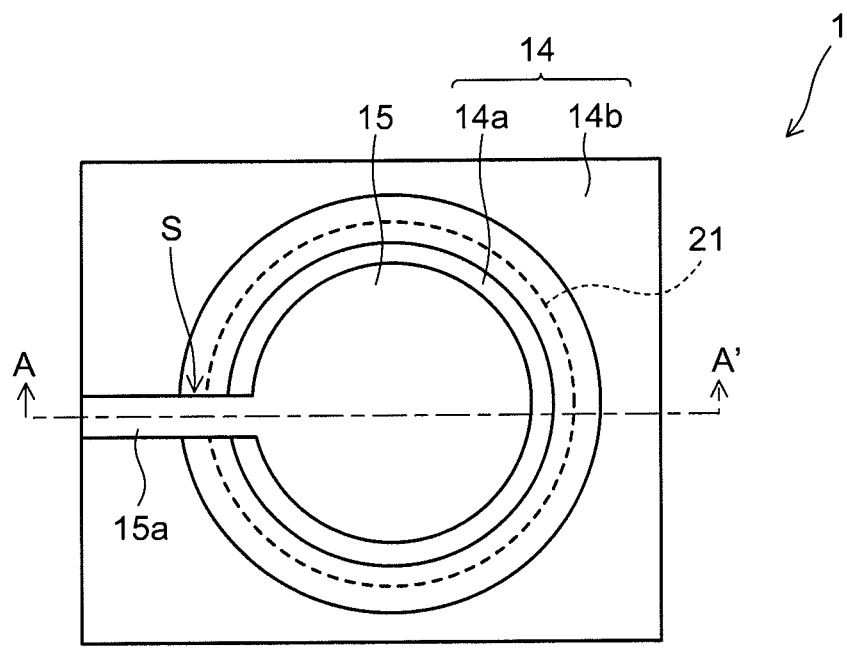
FIG. 1(a) is a plan view schematically showing the schematic configuration of a piezoelectric actuator 1 according to an embodiment of the present invention.
Figure 1B:
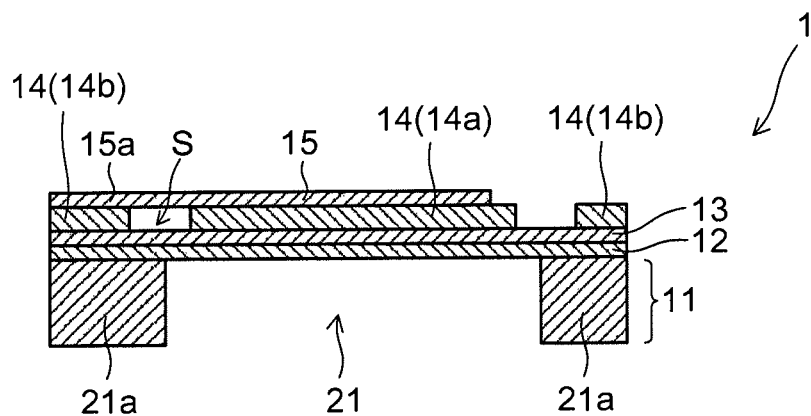
FIG. 1(b) is a cross-sectional view taken along line A-A' of FIG. 1(a) as seen along arrows.

FIG. 1(a) is a plan view schematically showing the schematic configuration of a piezoelectric actuator 1 according to the present embodiment; FIG. 1(b) is a cross-sectional view taken along line A-A' of FIG. 1(a) as seen along arrows. The piezoelectric actuator 1 is formed by stacking, on a substrate 11, a diaphragm 12, a lower electrode 13, a piezoelectric member 14 and an upper electrode 15 in this order. For convenience, the following description will be given with the diaphragm 12 located on a pressure chamber; however, the up/down direction is not limited, and the piezoelectric actuator 1 may face in any direction at the time of use.

The substrate 11 is formed with a semiconductor substrate made of a single crystal Si alone or a SOI (silicon on insulator) substrate. In the substrate 11, the pressure chamber 21 holding gas or liquid is formed, and the portion of the substrate 11 other than the pressure chamber 21 is the side wall 21a of the pressure chamber 21. In the present embodiment, the cross-sectional shape of the pressure chamber 21 parallel to the surface of the substrate 11 is circular, for example, it may be ellipsoidal, polygonal or the like.

The diaphragm 12 is an elastic member that is vibrated by the expansion and contraction of the piezoelectric member 14, and is formed on the substrate 11 so as to cover the pressure chamber 21 and the side wall 21a formed in the substrate 11. The diaphragm 12 is formed with, for example, a thermally oxidized film ($SiO_2$) obtained by thermally oxidizing the surface of the substrate 11; the diaphragm 12 may be formed with the thermally oxidized film described above and a Si layer that is part of the substrate 11 in the direction of its thickness.

The lower electrode 13 is formed by stacking, for example, a Ti layer and a Pt layer. The Ti layer is an intimate-contact layer for enhancing intimate contact between the diaphragm 12 (thermally oxidized film) and the Pt layer. The upper electrode 15 is formed by stacking, for example, a Cr layer and an Au layer. The Cr layer is an intimate-contact layer for enhancing intimate contact between the piezoelectric member 14 and the Au layer.

The piezoelectric member 14 is formed of a piezoelectric material such as a PZT (lead zirconate titanate), and is formed into a pattern on the lower electrode 13. The piezoelectric member 14 is separated by a gap portion S above the boundary surface between the side wall 21a of the pressure chamber 21 and the pressure chamber 21 in the substrate 11. In other words, the piezoelectric member 14 is separated by the gap portion S located above the side wall surface of the pressure chamber 21 into a piezoelectric member 14a located above the pressure chamber 21 and a piezoelectric member 14b located above the side wall 21a of the pressure chamber 21. The gap portion S is formed in the shape of, for example, a ring on the external side of (around) the piezoelectric member 14a, and the piezoelectric member 14b is further formed on the external side of the gap portion S.

The upper electrode 15 described above is drawn out over the gap portion S from an area above the pressure chamber 21 to an area on the piezoelectric member 14b above the side wall 21a of the pressure chamber 21. The upper electrode 15 drawn out onto the piezoelectric member 14b is hereinafter referred to as an upper electrode drawing portion 15a. The upper electrode drawing portion 15a and the lower electrode 13 are connected to an unillustrated voltage application portion.

In the above configuration, when voltage is applied to the upper electrode drawing portion 15a and the lower electrode 13, the piezoelectric member 14a above the pressure chamber 21 sandwiched between the upper electrode 15 and the lower electrode 13 expands and contracts in the horizontal direction, and piezoelectric distortion (piezoelectric displacement) is produced in the piezoelectric member 14a, with the result that the diaphragm 12 vibrates in the up/down direction. Hence, the vibration of the diaphragm 12 described above allows gas or liquid to be discharged from the pressure chamber 21; in this case, the piezoelectric actuator 1 can be used as a pump. By contrast, when the diaphragm 12 is vibrated, the expansion and contraction of the piezoelectric member 14a produce an electric field, and thus the piezoelectric actuator 1 can be used as a sensor by detecting the magnitude of the electric field and the frequency of a detection signal through the upper electrode 15 and the lower electrode 13.

Method of Manufacturing the Piezoelectric Actuator

A method of manufacturing the piezoelectric actuator 1 configured as described above will now be described. FIGS. 2(a) to 2(d), FIGS. 3(a) to 3(d) and FIGS. 4(a) to 4(d) are cross-sectional views sequentially showing a process of manufacturing the piezoelectric actuator 1 of the present embodiment.

Figure 2A:
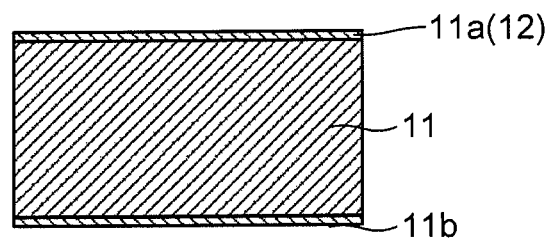
FIGS. 2(a) to 2(d) are cross-sectional views sequentially showing a process of manufacturing the piezoelectric actuator 1.

First, as shown in FIG. 2(a), the front surface and the back surface of the substrate 11 (for example, having a thickness of 200 μm) formed of Si are thermally oxidized, and thus a SiO₂ layer 11a (for example, having a thickness of 1 μm) and a SiO₂ layer 11b (for example, having a thickness of 1 μm) are formed on the individual surfaces. The substrate 11 with the SiO₂ layers 11a and 11b originally attached to both sides may be used. The SiO₂ layer 11a on the front surface side of the substrate 11 forms the diaphragm 12 described above.

Figure 2B:
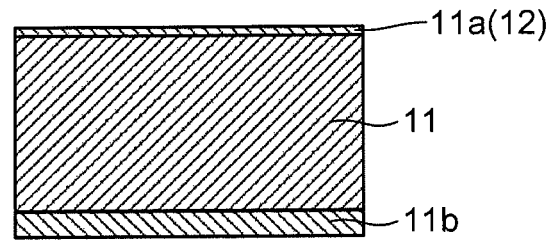

Then, as shown in FIG. 2(b), by a TEOS-CVD method using TEOS (tetraethoxysilane) as a raw material gas, a SiO₂ layer is further formed into a film on the back surface side of the substrate 11, and the thickness of the SiO₂ layer 11b is increased to, for example, 2 μm.

Figure 2C:
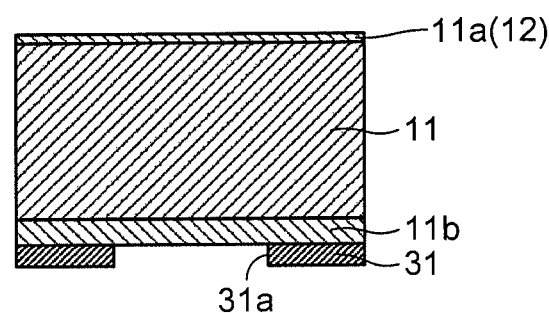

Then, as shown in FIG. 2(c), a resist is applied onto the SiO₂ layer 11b on the back surface side of the substrate 11, and exposure and development are performed to obtain a resist pattern 31. The resist pattern 31 is used to form the pressure chamber 21 (see FIG. 4(d)) in the substrate 11, and has a circular hole 31a of, for example, a diameter of 200 μm. The shape of the hole 31a is not limited to the circular shape described above, and may be another shape (for example, ellipsoidal or polygonal).

Figure 2D:
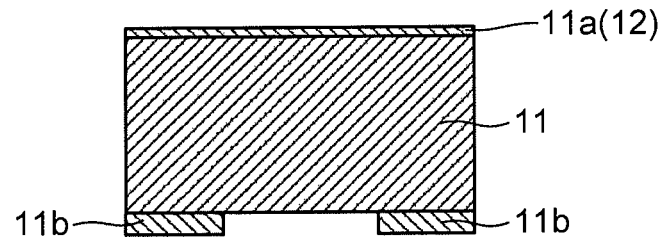

Then, as shown in FIG. 2(d), the resist pattern 31 is used as a mask, and the SiO₂ layer 11b on the back surface side of the substrate 11 is dry etched. The dry etching is performed by using a CHF₃ (trifluoromethane) gas with, for example, a RIE (reactive ion etching) device. The SiO₂ layer 11b that is not protected by the resist pattern 31 is removed by this dry etching.

Figure 3A:
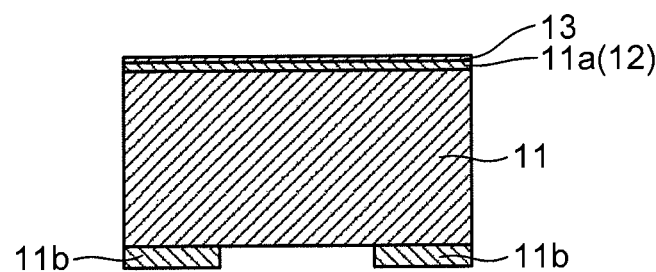
FIGS. 3(a) to 3(d) are cross-sectional views sequentially showing the process of manufacturing the piezoelectric actuator 1.

Then, as shown in FIG. 3(a), the Ti layer (for example, having a thickness of 20 nm) and the Pt layer (for example, having a thickness of 100 nm) are sequentially formed into films by sputtering on the SiO₂ layer 11a on the front surface side of the substrate 11, and thus the lower electrode 13 is formed. The Ti layer is an intimate-contact layer for bringing the SiO₂ layer 11a and the Pt layer into intimate contact.

Figure 3B:
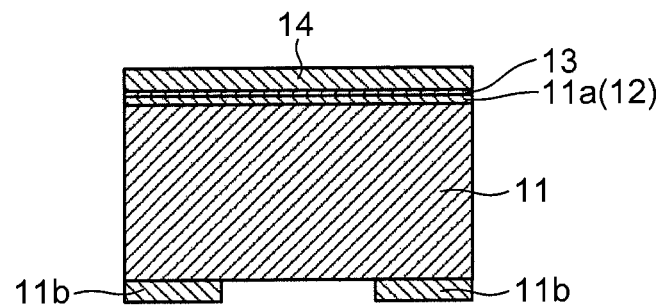

Thereafter, as shown in FIG. 3(b), on the lower electrode 13, the PZT is formed into a film by sputtering at a temperature of 600° C. to form the piezoelectric member 14 (for example, having a thickness of 3 μm). The piezoelectric member 14 has a perovskite-type structure for obtaining satisfactory piezoelectric characteristics where a Ti or Zr ion in the center of the crystalline lattice is deflected in the (111) direction. Since the piezoelectric member 14 is formed such that the (111) direction is perpendicular to the surface of the substrate 11, and thus polarization is greater than the case where the piezoelectric member 14 is formed such that, for example, a (001) direction is perpendicular to the surface of the substrate 11, it is possible to obtain large piezoelectric displacement.

Figure 3C:
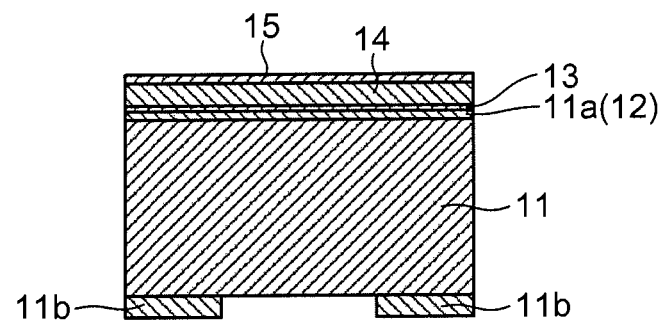

Then, as shown in FIG. 3(c), the Cr layer and the Au layer are formed into films in this order on the piezoelectric member 14 by sputtering, and thus the upper electrode 15 (for example, having a thickness of 0.2 μm) is formed. The Cr layer is an intimate-contact layer for bringing the piezoelectric member 14 and the Au layer into intimate contact.

Figure 3D:
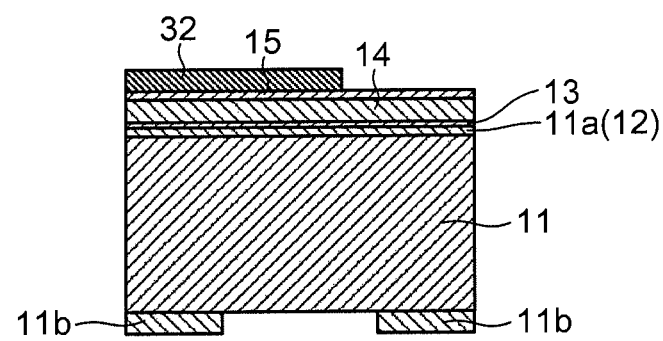

Then, as shown in FIG. 3(d), a resist is applied onto the upper electrode 15, and exposure and development are performed to form a resist pattern 32 for performing patterning on the upper electrode 15. In this case, the resist pattern 32 above the portion that is to be the upper electrode drawing portion 15a is formed such that its width is, for example, 5 μm. The above-mentioned width of 5 μm in the resist pattern 32 is determined with consideration given to the amount of side etching in the piezoelectric member 14, which will be described later, that is, the length of the side etching in the width direction (for example, having 3 μm).

Figure 4A:
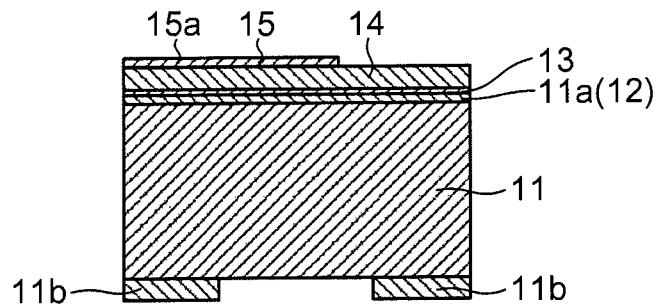
FIGS. 4(a) to 4(d) are cross-sectional views sequentially showing the process of manufacturing the piezoelectric actuator 1.

Then, as shown in FIG. 4(a), the resist pattern 32 is used as a mask, and thus the upper electrode 15 is wet etched. In this way, the upper electrode 15 is shaped to be drawn out along the upper surface of the piezoelectric member 14 from the area above the portion that is to be the pressure chamber 21 to the area above the portion that is to be the side wall 21a of the pressure chamber 21. Here, the width of the upper electrode drawing portion 15a located above the portion that is to be the side wall 21a of the pressure chamber 21 is set at, for example, 5 μm by the resist pattern 32.

Figure 4B:
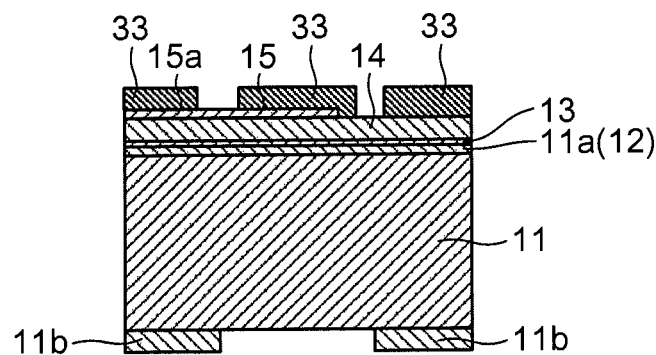

Then, as shown in FIG. 4(b), a resist is applied onto the piezoelectric member 14 and the upper electrode 15, and exposure and development are performed to form a resist pattern 33 for performing patterning on the piezoelectric member 14. Here, the resist pattern 33 described above is formed to include an upper portion of the upper electrode drawing portion 15a. Although in the present embodiment, an example has been described where no resist is applied onto the upper electrode drawing portion 15a on the area in which the gap portion S is formed in the piezoelectric member 14, the resist may also be applied onto the upper electrode drawing portion 15a on the area in which the gap portion S is formed.

Figure 4C:
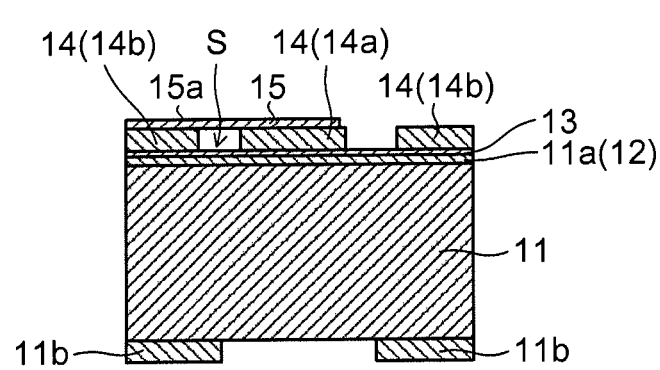

Then, as shown in FIG. 4(c), the piezoelectric member 14 is wet etched by hydrofluoric-nitric acid. Thus, the piezoelectric member 14a of, for example, a diameter of 180 μm and the piezoelectric member 14b outside it are formed so as to be separated by a groove (a portion obtained by removing the piezoelectric member 14) of, for example, a width of 40 μm.

Here, when the wet etching is performed on the piezoelectric member 14, etching in the horizontal direction (side etching) is also performed simultaneously with etching in the vertical direction. Since the piezoelectric member 14 under the upper electrode drawing portion 15a is also etched away in the horizontal direction by this side etching, the gap portion S where the piezoelectric member 14 is not present is formed between the upper electrode drawing portion 15a and the lower electrode 13. Hence, the upper electrode drawing portion 15a is formed over the gap portion S from the area on the piezoelectric member 14a to the area on the piezoelectric member 14b.

Here, when the amount of side etching on the piezoelectric member 14 is assumed to be, for example, 3 μm, since the width of the upper electrode drawing portion 15a is 5 μm, which is twice or less the amount of side etching on the piezoelectric member 14, the piezoelectric member 14 located under the upper electrode drawing portion 15a can be reliably removed by the side etching from both sides in the direction of the width of the upper electrode drawing portion 15a.

When the amount of side etching on the piezoelectric member 14 is assumed to be, for example, 3 μm, if the resist pattern 33 corresponding to a groove 34 μm in width is formed, since both sides of the groove (the side of the piezoelectric member 14a and the side of the piezoelectric member 14b) are individually side etched by 3 μm, it is possible to finally form a groove 40 μm in width.

Figure 5:
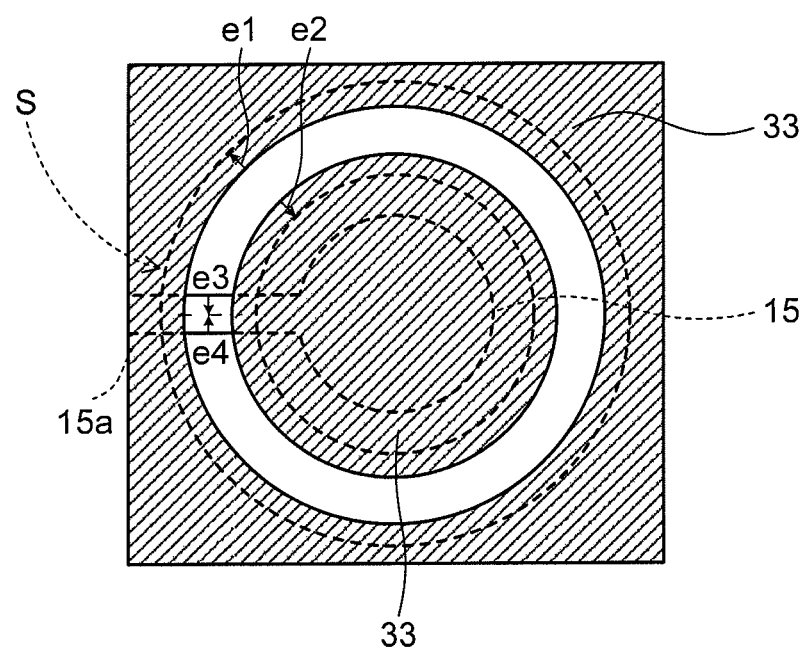
FIG. 5 A plan view showing a state where a resist pattern is formed in the process of FIG. 4(b) of the process of manufacturing the piezoelectric actuator 1.

FIG. 5 is a plan view of FIG. 4(b) schematically showing the state where the resist pattern 33 is formed on the piezoelectric member 14 and the upper electrode 15. Although in the figure, the resist pattern 33 is formed in a portion indicated by the hatched portion, by the side etching from the portion onto which no resist is applied, the piezoelectric member 14 under the resist pattern 33 is removed only by the amounts of side etching e1 and e2. Since the width of the upper electrode drawing portion 15a is set at twice or less the amount of side etching on the piezoelectric member 14, and thus the piezoelectric member 14 located under the upper electrode drawing portion 15a is side etched from both sides in the direction of the width of the upper electrode drawing portion 15a (the amounts of side etching are assumed to be e3 and e4), it is possible to reliably remove the piezoelectric member 14 in this portion.

Figure 4D:
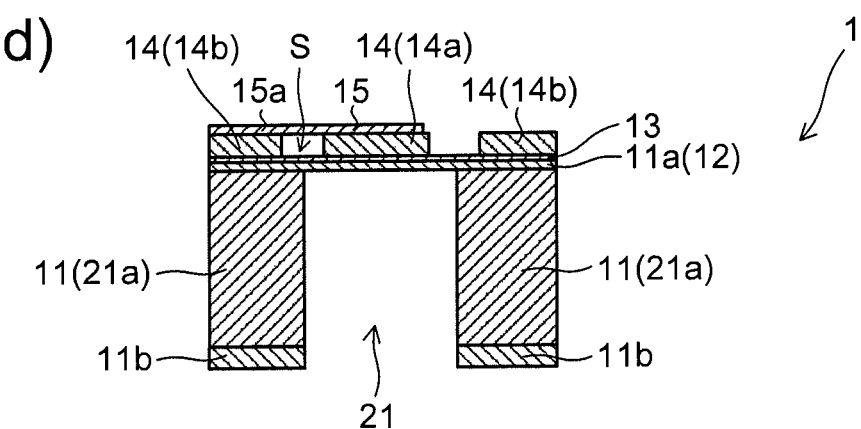

Then, as shown in FIG. 4(d), the pattern of the SiO$_2$ layer 11b on the back surface side of the substrate 11 is used as a mask, and the substrate 11 is subjected to deep digging processing in the Bosch process of an ICP (inductive coupled plasma) device, and thus the pressure chamber 21 of, for example, a diameter of 200 μm is formed. In this way, the piezoelectric actuator 1 is completed. Here, the portion other than the pressure chamber 21 in the substrate 11 forms the side wall 21a of the pressure chamber 21. The piezoelectric member 14a described above corresponds to the piezoelectric member located above the pressure chamber 21; the piezoelectric member 14b corresponds to the piezoelectric member located above the side wall 21a of the pressure chamber 21.

Applications of the Piezoelectric Actuator

Figure 6:
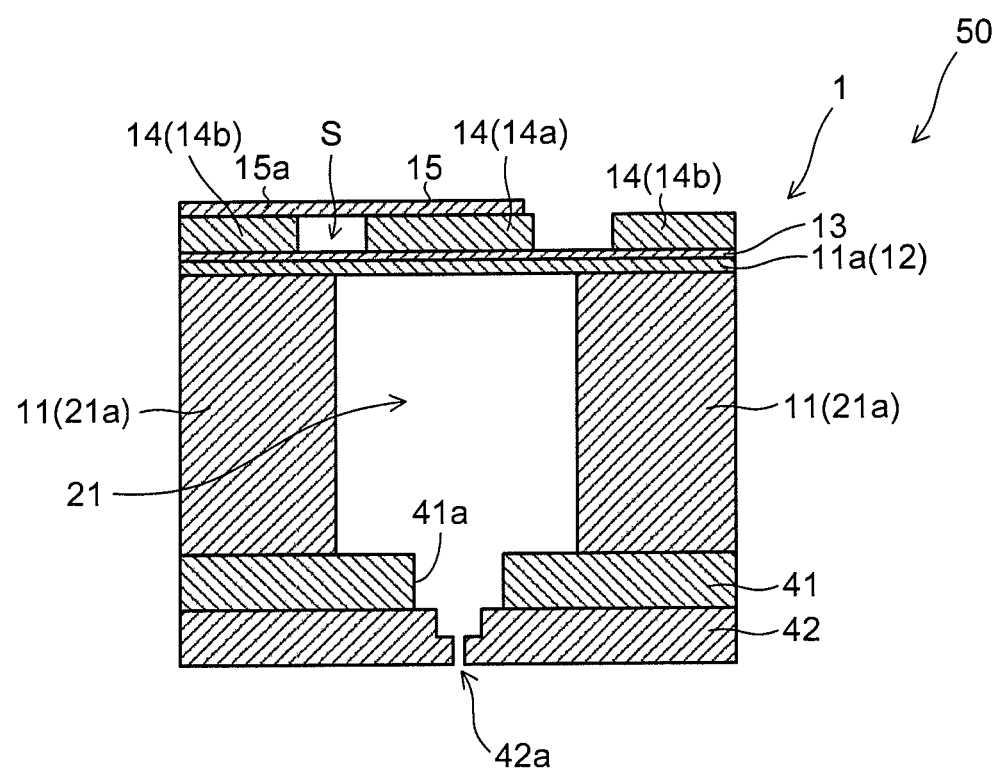
FIG. 6 A cross-sectional view showing the schematic configuration of an ink-jet head to which the piezoelectric actuator 1 is applied.

The piezoelectric actuator 1 of the present embodiment can be applied to, for example, an ink-jet head. FIG. 6 is a cross-sectional view showing the schematic configuration of an ink-jet head 50. After removal of the SiO$_2$ layer 11b on the back surface side of the substrate 11 in the piezoelectric actuator 1 by etching processing, a nozzle plate 42 formed of Si of, for example, a thickness of 300 μm is adhered, through a glass substrate 41 of, for example, a thickness of 200 μm, by anodic bonding, to the back surface side of the substrate 11, and thus it is possible to produce the ink-jet head 50. In the glass substrate 41 described above, a hole 41a of, for example, a diameter of 100 μm is formed; in the nozzle plate 42, a discharge outlet 42a formed with two stacked holes of a diameter of 50 μm and of a diameter of 20 μm is formed. Hence, the ink with which the pressure chamber 21 is filled is discharged by the vibration of the diaphragm 12 through the discharge outlet 42a in the nozzle plate 42 via the hole 41a of the glass substrate 41.

The piezoelectric actuator 1 of the present embodiment can also be applied to an ultrasonic sensor, that is, the transmission and reception element of an ultrasonic prove. For example, by applying an alternating-current voltage whose frequency corresponds to the frequency of ultrasonic waves to be transmitted, between the upper electrode 15 and the lower electrode 13 of the piezoelectric actuator 1, it is possible to transmit ultrasonic waves. At the time of reception, the ultrasonic waves reflected off a member to be detected enter the pressure chamber 21 of the piezoelectric actuator 1, and vibrate the diaphragm 12 on the pressure chamber 21, and an electric field is produced on the piezoelectric member 14 by the piezoelectric effect resulting from the vibration. The amplitude, the frequency and the phase of the electric field are detected through the lower electrode 13 and the upper electrode 15, and thus it is possible to obtain a two-dimensional ultrasonic image, with the result that the piezoelectric actuator 1 can be made to function as the reception element of the ultrasonic probe.

As described above, the piezoelectric member 14 of the piezoelectric actuator 1 of the present embodiment is separated, under the upper electrode drawing portion 15a, by the gap portion S, into the piezoelectric member 14a above the pressure chamber 21 and the piezoelectric member 14b above the side wall 21a of the pressure chamber 21. Thus, since the piezoelectric member 14b is prevented from suppressing the displacement of the piezoelectric member 14a, it is possible to avoid a decrease in the piezoelectric displacement of the piezoelectric member 14a. The portion where a crack is most likely to be produced by stress concentration, that is, the portion located above the boundary surface between the pressure chamber 21 and the side wall 21a in the piezoelectric member 14 is the gap portion S where the piezoelectric member 14 is not present, and thus it is also possible to prevent the upper electrode drawing portion 15a from being broken by a crack in the piezoelectric member 14.

In the present embodiment, the upper electrode drawing portion 15a is formed over the gap portion S; this configuration can be easily realized, as described above, by removing the piezoelectric member 14 under the upper electrode drawing portion 15a by side etching when the piezoelectric member 14 is subjected to patterning. Hence, as compared with the configuration in which the upper electrode 15 is drawn out from the upper surface of the piezoelectric member 14 closely along the side surface, even if the thickness of the piezoelectric member 14 is large, it is possible to easily and reliably draw out the upper electrode 15.

In the piezoelectric actuator 1 of the present embodiment, since it is possible to avoid a decrease in the piezoelectric displacement as described above, it can also be said that it is possible to reduce the applied voltage necessary for obtaining the same piezoelectric displacement. In terms of what has been described above and the prevention of breakage of the upper electrode drawing portion 15*a*, the piezoelectric actuator 1 is applied to the ink-jet head 50, and thus it is possible to reduce the power consumption of the ink-jet head 50 and to increase the life thereof.

Other Examples of the Configuration of the Piezoelectric Actuator

Figure 7A:
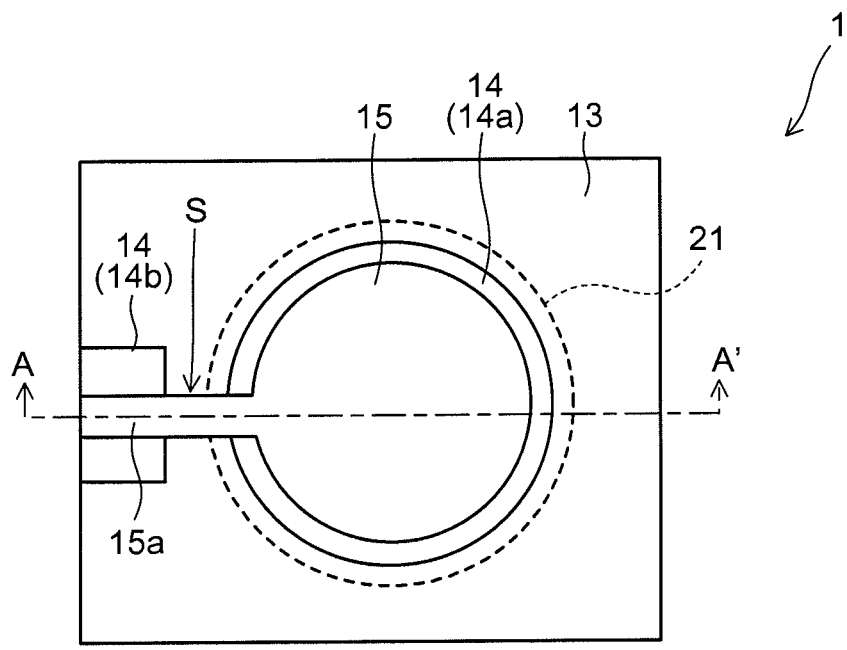
FIG. 7(a) is a plan view schematically showing another configuration 1 of the piezoelectric actuator 1.
Figure 7B:
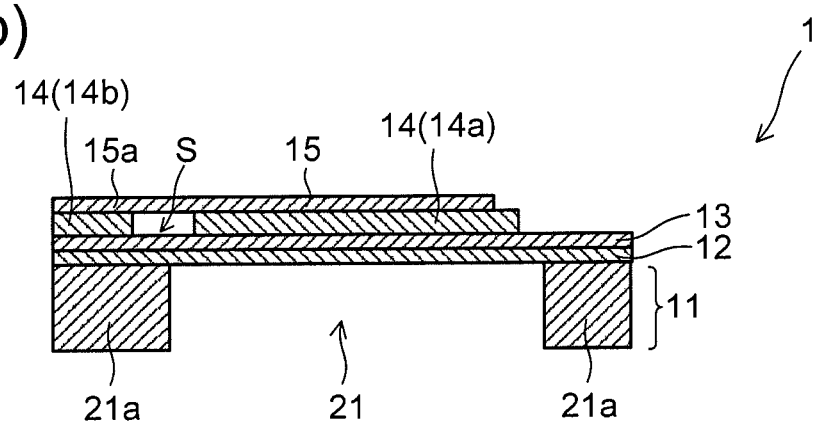
FIG. 7(b) is a cross-sectional view taken along line A-A' of FIG. 7(a) as seen along arrows.

FIG. 7(*a*) is a plan view schematically showing another configuration 1 of the piezoelectric actuator 1 of the present embodiment; FIG. 7(*b*) is a cross-sectional view taken along line A-A' of FIG. 7(*a*) as seen along arrows. It is not necessary to form the piezoelectric member 14 according to the range of the formation of the lower electrode 13; the piezoelectric member 14 may be formed only in the area above the pressure chamber 21 and in the area from which the upper electrode drawing portion 15*a* is drawn out among the areas above the side walls 21*a* of the pressure chamber 21.

Figure 8:
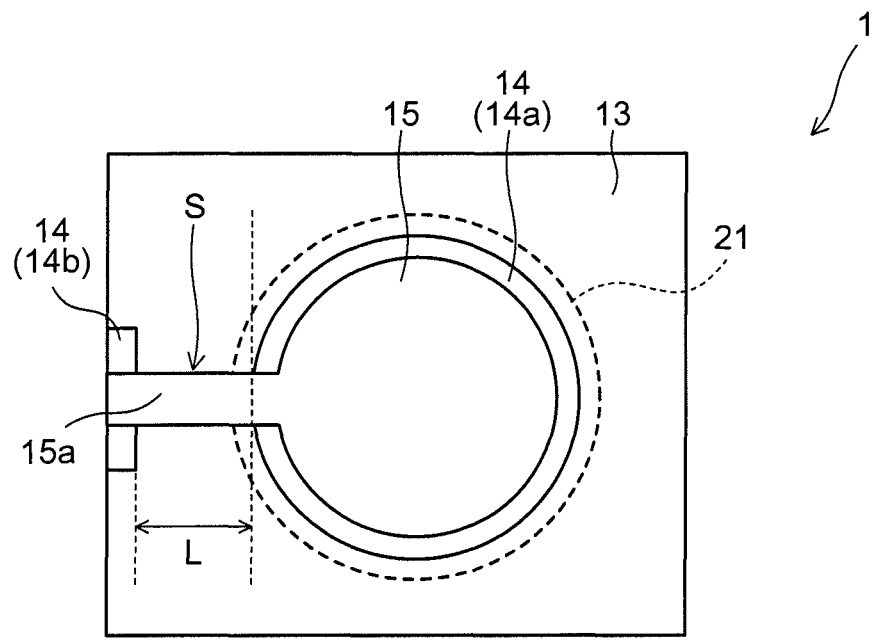
FIG. 8 A plan view schematically showing another configuration 2 of the piezoelectric actuator 1.

FIG. 8 is a plan view schematically showing further another configuration 2 of the piezoelectric actuator 1. As shown in the figure, since as the drawing length L (the length on the gap portion S in the direction of the drawing) of the upper electrode drawing portion 15*a* is increased, it is possible to suppress stress applied to the upper electrode drawing portion 15*a* when the piezoelectric member 14*a* expands and contracts, it is preferable to increase the drawing length L.

The results of simulation on a relationship between the drawing length L of the upper electrode drawing portion 15*a* and the stress applied to the upper electrode drawing portion 15*a* will be described below. Although in the following description, the piezoelectric actuator 1 is produced using an SOI substrate as the substrate 11, and the simulation is performed, the same tendency is probably shown even when a Si substrate is used as the substrate 11.

Figure 9A:
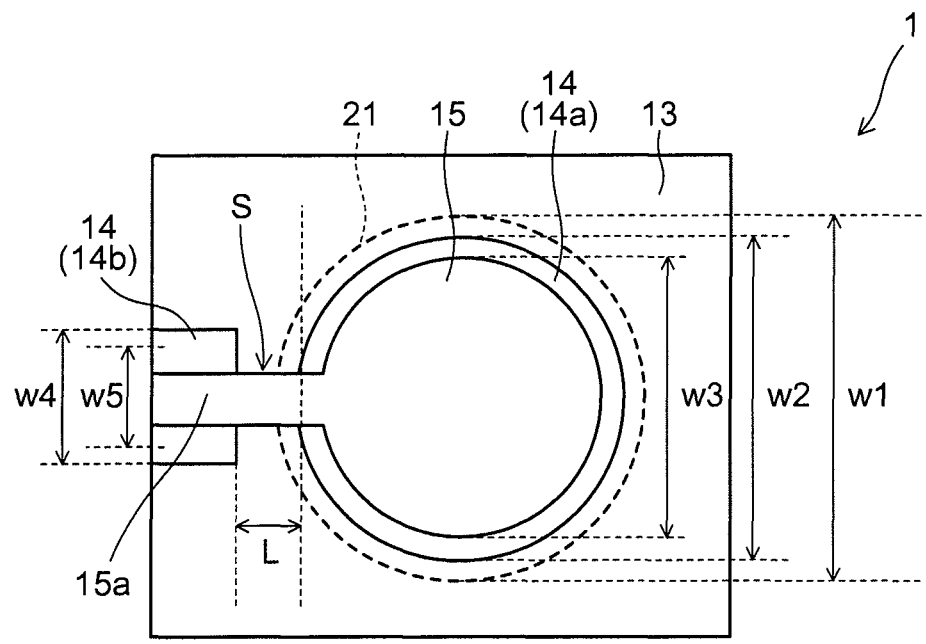
FIG. 9(a) is a plan view of the piezoelectric actuator 1 produced with a SOI substrate.
Figure 9B:
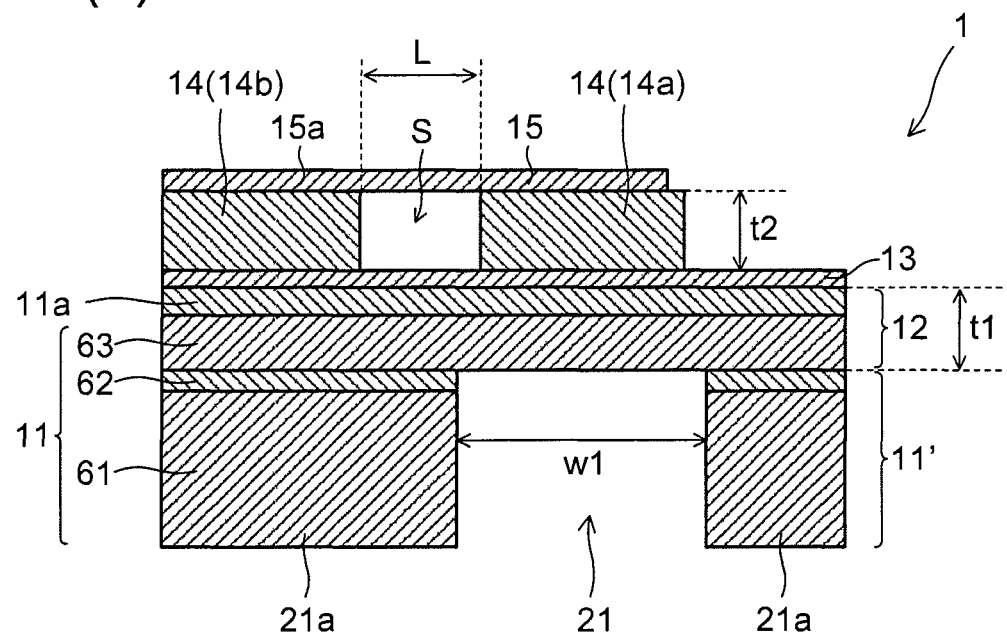
FIG. 9(b) is a cross-sectional view of the piezoelectric actuator 1.

FIG. 9(*a*) is a plan view of the piezoelectric actuator 1 that has the same shape as in the other configuration 1 described above and that is produced using the SOI substrate; FIG. 9(*b*) is a cross-sectional view of the piezoelectric actuator 1 described above. The SOI substrate serving as the substrate 11 is one that is obtained by forming a Si substrate 63 through an insulting film 62 made of $SiO_2$ on a Si substrate 61. In a case where the SOI substrate is used as the substrate 11, when the pressure chamber 21 is formed by digging the substrate 11, the insulting film 62 functions as an etching stopper and thus it is possible to accurately form the pressure chamber 21 in the thickness direction.

Here, the diaphragm 12 is formed with the $SiO_2$ layer 11*a* on the front surface side of the substrate 11 and the Si substrate 63. Hence, if it is assumed that the remaining portion of the SOI substrate, that is, the Si substrate 61 and the insulting film 62 are a substrate 11', the diaphragm 12 can be considered to be formed on the substrate 11'.

It is now assumed that the thickness of the diaphragm 12 is t1 μm, the thickness of the PZT which is the piezoelectric member 14 is t2 μm, the diameter of the pressure chamber 21 is w1 μm, the diameter of the PZT of the piezoelectric member 14*a* above the pressure chamber 21 is w2 μm, the diameter of the upper electrode 15 above the pressure chamber 21 is w3 μm, the width of the piezoelectric member 14*b* (drawing portion PZT) under the upper electrode drawing portion 15*a* is w4 μm, the width of the upper electrode drawing portion 15*a* is w5 μm and the drawing length L of the upper electrode drawing portion 15*a* on the gap portion S is L μm.

With respect to the initial stress, with consideration given to only the stress of the PZT (for example, which is assumed to be 100 MPa), it is assumed that the absolute value of the piezoelectric constant ($d_{31}$) of the PZT is 150 pm/V, the drive voltage of the PZT is 15 V and the Young's modulus of the PZT is 60 GPa. Table 1 shows, under such conditions, variations in piezoelectric displacement and stress as the drawing length L of the upper electrode drawing portion 15*a* above the gap portion S is varied.

TABLE 1

| No. | DIAPHRAGM THICKNESS (μm) t1 | PZT THICKNESS (μm) t2 | PRESSURE CHAMBER DIAMETER (μm) w1 | PZT DIAMETER (μm) w2 | UPPER ELECTRODE DIAMETER (μm) w3 | DRAWING PORTION PZT WIDTH (μm) w4 |
|---|---|---|---|---|---|---|
| 1 (CONVENTIONAL EXAMPLE) | 3.0 | 3.0 | 200 | 180 | 160 | 70 |
| 2 | 3.0 | 3.0 | 200 | 180 | 160 | 70 |
| 3 | 3.0 | 3.0 | 200 | 180 | 160 | 70 |
| 4 | 3.0 | 3.0 | 200 | 180 | 160 | 70 |
| 5 | 3.0 | 3.0 | 200 | 180 | 160 | 70 |
| 6 | 3.0 | 3.0 | 200 | 180 | 160 | 70 |

| No. | UPPER ELECTRODE DRAWING PORTION WIDTH (μm) w5 | DRAWING LENGTH (μm) L | DISPLACEMENT AMOUNT PIEZOELECTRIC DISPLACEMENT Δz (nm) a1 | STRESS MAXIMUM VALUE DRAWING PZT 15 V (MPa) a2 | STRESS MAXIMUM VALUE DRAWING ELECTRODE 15 V (MPa) a3 |
|---|---|---|---|---|---|
| 1 (CONVENTIONAL EXAMPLE) | 5 | 0 | 233 | 241 | 129 |
| 2 | 5 | 40 | 266 | 0 | 345 |
| 3 | 5 | 80 | 266 | 0 | 202 |
| 4 | 5 | 130 | 266 | 0 | 162 |
| 5 | 5 | 180 | 266 | 0 | 134 |
| 6 | 5 | 230 | 267 | 0 | 90 |

In Table 1, lot No. 1 has the conventional configuration in which the drawing length L=0, that is, the piezoelectric member 14 is not separated by the gap portion S. Lot Nos. 2 to 6 have the configuration of the present embodiment in which the piezoelectric member 14 is separated by the gap portion S. It is found from the result of lot Nos. 1 to 6 that in the configuration where the piezoelectric member 14 is separated by the gap portion S, as compared with the configuration where the piezoelectric member 14 is not separated, the piezoelectric displacement a1 of the piezoelectric member 14a is increased. It is also found from lot Nos. 2 to 6 that as the drawing length L on the gap portion S is increased, the maximum value of the stress placed on the upper electrode drawing portion 15a is decreased, with the result that it can be said that the effect of preventing the upper electrode drawing portion 15a from being broken is significant.

In lot No. 1, the maximum value of the stress placed on the drawing portion of the upper electrode is lower than those of lot No. 2 and the like; this is a value when no crack is produced in the piezoelectric member. It has been found that when a crack is produced in the piezoelectric member, the stress of the value of lot No. 2 or higher is applied.

Variations in the Shape of the Upper Electrode Drawing Portion

Figure 10A:
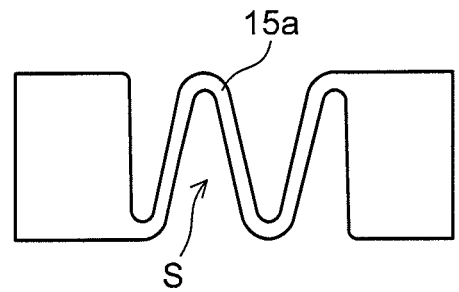
FIGS. 10(a) to 10(d) are plan views showing variations in the shape of an upper electrode drawing portion on a gap portion.
Figure 10B:
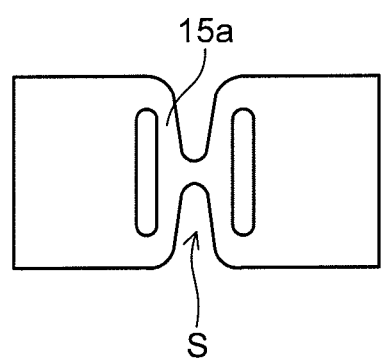
Figure 10C:
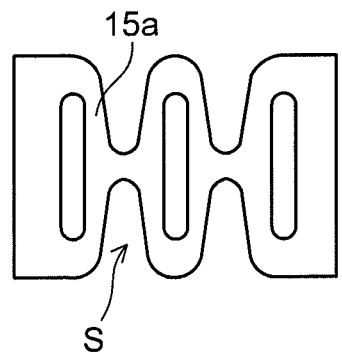
Figure 10D:
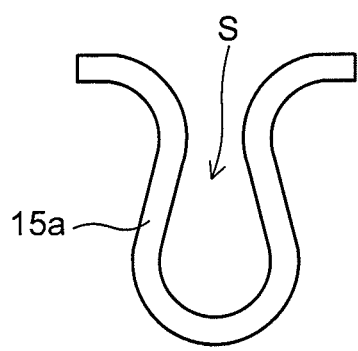

Variations in the shape of the upper electrode drawing portion 15a will now be described. FIGS. 10(a) to 10(d) are plan views showing variations in the shape of the upper electrode drawing portion 15a on the gap portion S. As with these variations, the upper electrode drawing portion 15a on the gap portion S is preferably formed to be bent within the plane parallel to the stacking surface of the upper electrode. In the example of FIG. 10(a), on the gap portion S, the upper electrode drawing portion 15a of a narrowed width is formed so as to meander in the up/down direction of the figure. In the example of FIG. 10(b), the width of part of the upper electrode drawing portion 15a is narrowed, holes are provided on its left and right portions and the upper electrode drawing portion 15a is formed in the shape of the alphabetical letter H, with the result that the upper electrode drawing portion 15a is bent on the gap portion S. In the example of FIG. 10(c), in the intermediate position between the left and right holes in the shape of FIG. 10(b), a portion of a long width with a hole in the middle is formed. In the example of FIG. 10(d), the width of the entire upper electrode drawing portion 15a is narrow, and the upper electrode drawing portion 15a is bent in the up/down direction in the figure and is formed in the shape of the alphabetical letter U.

In this case, when the piezoelectric member 14a above the pressure chamber 21 expands, the upper electrode drawing portion 15a contracts in the left/right direction in the figure whereas, when the piezoelectric member 14a contracts, the upper electrode drawing portion 15a expands in the left/right direction. Thus, it is possible to suppress the stress placed on the upper electrode drawing portion 15a by the expansion and contraction of the piezoelectric member 14a and to reliably prevent the upper electrode drawing portion 15a from being broken. Since it is possible to reduce the load by the upper electrode drawing portion 15a on the piezoelectric member 14a, it is possible to reliably avoid a decrease in piezoelectric displacement. FIGS. 10(a) to 10(d) show the examples of part of variations in the shape of the upper electrode drawing portion 15a; as long as the shape can contract and expand according to the displacement of the piezoelectric member 14a, the present invention is not limited to the shape described above, and various other shapes can be adopted.

When the upper electrode drawing portion 15a is formed to be bent within the plane parallel to the stacking surface of the upper electrode 15, the width of the upper electrode drawing portion 15a is set at twice or less the amount of side etching on the piezoelectric member 14, and thus the piezoelectric member 14 that is to be gap portion S is reliably removed by the side etching, with the result that it is possible to reliably form the upper electrode drawing portion 15a over the gap portion S.

Figure 11:
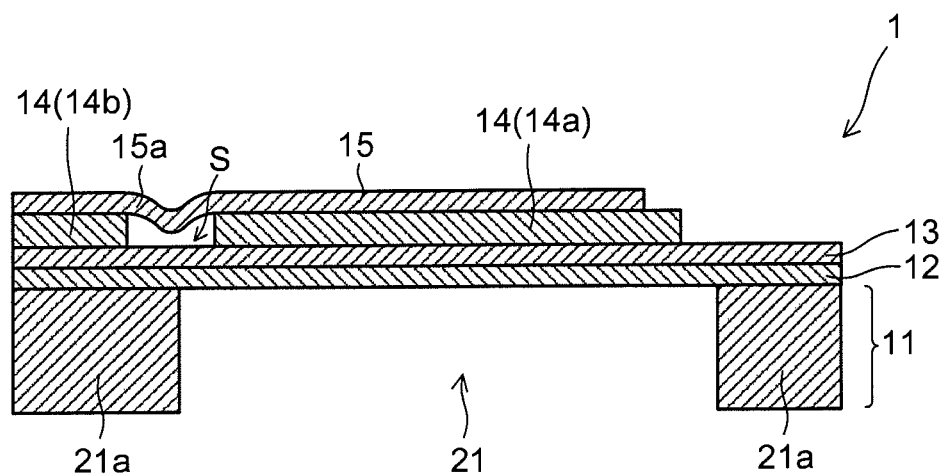
FIG. 11 A diagram showing another configuration 3 of the piezoelectric actuator 1, and a cross-sectional view showing further another shape of the upper electrode drawing portion.

FIG. 11 is a diagram showing further another configuration 3 of the piezoelectric actuator 1, and is a cross-sectional view showing further another shape of the upper electrode drawing portion 15a. As shown in the figure, the upper electrode drawing portion 15a on the gap portion S may be formed so as to be bent into the gap portion S in the initial state before the displacement of the piezoelectric member 14a.

This configuration can be realized as follows: for example, before the upper electrode 15 (including the upper electrode drawing portion 15a) is formed into a film on the piezoelectric member 14 by sputtering, the surface of the piezoelectric member 14 that is to be the gap portion S is recessed by etching, the upper electrode 15 is formed thereon and thereafter the piezoelectric member 14 that is to be the gap portion S is removed by side etching. The substrate 11 is formed of $ZrO_2$, and the upper electrode 15 is formed of Pt, and thus it is possible to configure the upper electrode drawing portion 15a such that the upper electrode drawing portion 15a places contraction stress on the substrate 11; in this way, it is also possible to bend the upper electrode drawing portion 15a on the gap portion S in the initial state before the displacement of the piezoelectric member 14a. Furthermore, as compared with the substrate 11, the upper electrode 15 is formed of a material having a low coefficient of thermal expansion, and thus it is also possible to configure the upper electrode drawing portion 15a such that the upper electrode drawing portion 15a places contraction stress on the substrate 11. This configuration can be realized by forming, for example, the substrate 11 of SUS304, Ni, MgO or $ZrO_2$, and forming the upper electrode 15 of Pt.

As described above, if the upper electrode drawing portion 15a is bent into the gap portion S in the initial state, when the piezoelectric member 14a above the pressure chamber 21 expands, the upper electrode drawing portion 15a is further bent by the contraction stress whereas, when the piezoelectric member 14a contracts, the amount of bending of the upper electrode drawing portion 15a is reduced by the tensile stress. In either case, since the stress resulting from the expansion and contraction of the piezoelectric member 14a is suppressed by the upper electrode drawing portion 15a, it is possible to further reliably prevent the upper electrode drawing portion 15a from being broken by the expansion and contraction of the piezoelectric member 14a. In particular, the tensile stress placed on wiring (the upper electrode drawing portion 15a) resulting from the contraction of the piezoelectric member 14a is suppressed, and thus it is possible to prevent the wiring from being broken.

Figure 12:
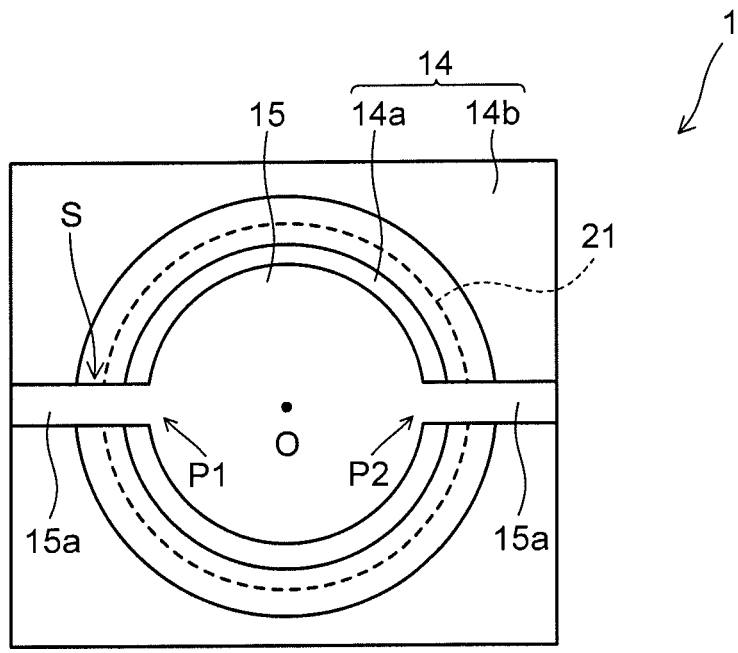
FIG. 12 A diagram showing another configuration 4 of the piezoelectric actuator 1, and a plan view showing further another shape of the upper electrode drawing portion.

FIG. 12 is a diagram showing further another configuration 4 of the piezoelectric actuator 1, and is a plan view showing further another shape of the upper electrode drawing portion 15a. As shown in the figure, when the piezoelectric member 14 is separated by the ring-shaped gap portion S into the piezoelectric member 14a (first piezoelectric member) located above the pressure chamber 21 and the piezoelectric member 14b (second piezoelectric member) formed above the side wall 21a of the pressure chamber 21 so as to surround the piezoelectric member 14a, the upper electrode drawing, portion 15a may be formed by drawing out the upper electrode 15 above the pressure chamber 21 from positions P1 and P2 symmetric with respect to the center O of the pressure chamber 21 over the gap portion S in the directions opposite to each other.

In this configuration, the direction in which the pressure chamber 21 is vibrated by the expansion and contraction of the piezoelectric member 14a can be brought close to a direction perpendicular to the surface of the substrate 11, and thus the characteristic of the piezoelectric actuator 1 serving as the actuator is enhanced. Hence, in particular, in the transmission and reception element of the ultrasonic probe, the above configuration of the piezoelectric actuator 1 is very effective.

Specifically, in the transmission and reception element of the ultrasonic probe, spherical wave-shaped ultrasonic waves are emitted at certain emission angles from oscillators (corresponding to the diaphragm 12) aligned in an array. By controlling the phases of the oscillators, it is possible to converge (focus) and scan the spherical wave-shaped ultrasonic waves emitted from the oscillators, (which is also referred to as beam forming).

When the oscillators are asymmetric, the direction in which the ultrasonic waves are emitted is displaced from the center axis, and thus it is impossible to obtain uniform spherical waves. Consequently, in the beam forming, the following problems occur and the image quality is degraded.

(1) It is impossible to obtain target focus accuracy.
(2) It is impossible to obtain a target scanning angle.
(3) The unintended production of a side lobe and a grating lobe causes the production of an artifact (an image that is not originally present appears on a screen).

However, since the upper electrode drawing portion 15a is drawn out as described above, and thus it is possible to bring the direction in which the diaphragm 12 is vibrated close to the vertical direction, it is possible to avoid the above problems in the transmission and reception element of the ultrasonic probe and thereby obtain high transmission/reception performance.

Figure 13:
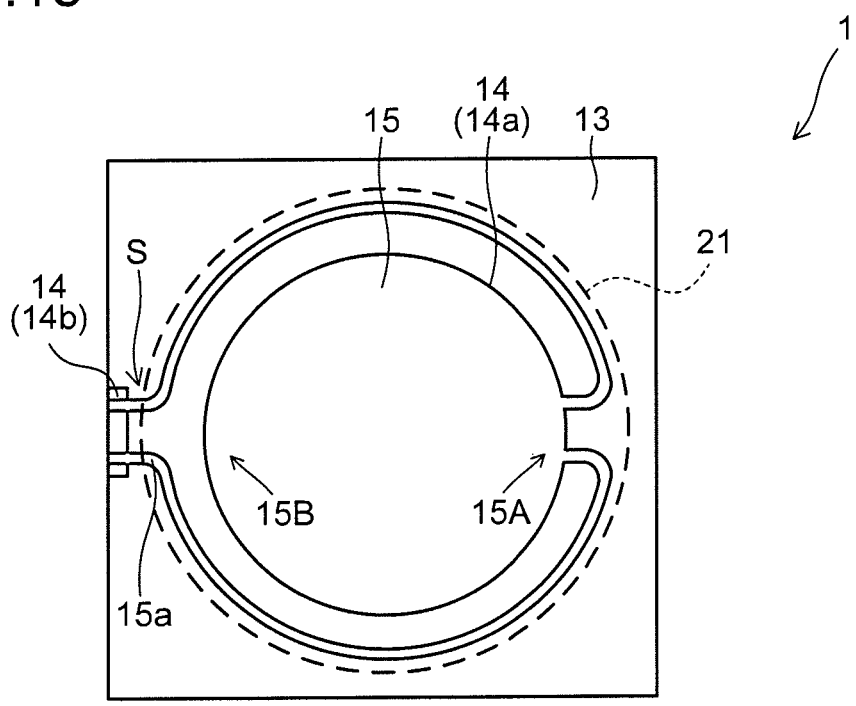
FIG. 13 A diagram showing another configuration 5 of the piezoelectric actuator 1, and a plan view showing further another shape of the upper electrode drawing portion.

FIG. 13 is a diagram showing further another configuration 5 of the piezoelectric actuator 1, and is a plan view showing further another shape of the upper electrode drawing portion 15a. The figure shows a case where the upper electrode 15 above the pressure chamber 21 is formed to have the same size (diameter) as the piezoelectric member 14a. In the upper electrode 15 above the pressure chamber 21, the end portions on the sides opposite to each other are assumed to be a first end portion 15A and a second end portion 15B, respectively. Here, preferably, the upper electrode drawing portion 15a is drawn from the first end portion 15A of the upper electrode 15 through the outside of the piezoelectric member 14a above the pressure chamber 21 to the side of the second end portion 15B, is then further extended in a direction opposite to the first end portion 15A and is drawn out onto the piezoelectric member 14b above the side wall 21a of the pressure chamber 21.

In this configuration, since the upper electrode drawing portion 15a is drawn out around the piezoelectric member 14a above the pressure chamber 21, as compared with the configuration in which the upper electrode drawing portion 15a is linearly drawn out from the upper electrode 15 above the pressure chamber 21, it is possible to obtain an extra length of the upper electrode drawing portion 15a on the region where the piezoelectric member 14 is not present. In this way, it is possible to obtain substantially the same effect as when the distance between the piezoelectric members 14a and 14b (the length of the upper electrode drawing portion 15a on the gap portion S) is increased.

In other words, even if the distance between the piezoelectric member 14a above the pressure chamber 21 and the piezoelectric member 14b above the side wall 21a of the pressure chamber 21 is decreased as compared with the configuration in which the upper electrode drawing portion 15a is linearly drawn out, it is possible to realize the suppression of the stress approximately equal to that in the configuration in which the upper electrode drawing portion 15a is linearly drawn out. Thus, it is possible to suppress, while reducing the size of the actuator, the stress of the upper electrode drawing portion 15a and prevent the breakage of the upper electrode drawing portion 15a.

Although in FIG. 13, two lines of the upper electrode drawing portion 15a are drawn out from the first end portion 15A of the upper electrode 15 so as to extend around the upper electrode 15 in the directions opposite to each other, the number of lines of the upper electrode drawing portion 15a may be one. However, since it is possible to draw out the upper electrode drawing portion 15a in a balanced manner and to expand and contract the piezoelectric member 14a above the pressure chamber 21 in a balanced manner, two lines of the upper electrode drawing portion 15a are preferably drawn out as described above.

Others

As in the present embodiment, when the upper electrode drawing portion 15a is formed over the gap portion S, since the upper electrode drawing portion 15a is opposite the lower electrode 13 through the gap portion S, depending on the drive frequency of the piezoelectric member 14 (the frequency of a voltage applied to the electrode), the upper electrode drawing portion 15a may be resonated to make contact with the lower electrode 13. Hence, thus it is preferable to avoid, the natural frequency of the upper electrode drawing portion 15a is changed, contact between the upper electrode drawing portion 15a and the lower electrode 13 when the piezoelectric member 14 is driven. The natural frequency of the upper electrode drawing portion 15a can be easily changed by, for example, adjusting the length of the upper electrode drawing portion 15a.

Although the Cr layer that is the foundation layer of the upper electrode 15 is easily corroded by the etching solution for the piezoelectric member 14, a W (tungsten) layer is formed instead of the Cr layer, and thus it is possible to reduce the corrosion by the etching solution.

INDUSTRIAL APPLICABILITY

The piezoelectric actuator of the present invention can be utilized for, for example, an ink-jet head and the transmission and reception element of an ultrasonic probe.

LIST OF REFERENCE SYMBOLS 1 piezoelectric actuator
11 substrate
11' substrate
12 diaphragm
13 lower electrode
14 piezoelectric member
14a piezoelectric member (first piezoelectric member)
14b piezoelectric member (second piezoelectric member)
15 upper electrode
15A first end portion
15B second end portion
15a upper electrode drawing portion
21 pressure chamber 21a side wall
42 nozzle plate
S gap portion
e1, e2, e3, e4 the amount of side etching

TABLE 1

| No. | DIAPHRAGM THICKNESS (μm) t1 | PZT THICKNESS (μm) t2 | PRESSURE CHAMBER DIAMETER (μm) w1 | PZT DIAMETER (μm) w2 | UPPER ELECTRODE DIAMETER (μm) w3 | DRAWING PORTION PZT WIDTH (μm) w4 |
|---|---|---|---|---|---|---|
| 1 (CONVENTIONAL EXAMPLE) | 3.0 | 3.0 | 200 | 180 | 160 | 70 |
| 2 | 3.0 | 3.0 | 200 | 180 | 160 | 70 |
| 3 | 3.0 | 3.0 | 200 | 180 | 160 | 70 |
| 4 | 3.0 | 3.0 | 200 | 180 | 160 | 70 |
| 5 | 3.0 | 3.0 | 200 | 180 | 160 | 70 |
| 6 | 3.0 | 3.0 | 200 | 180 | 160 | 70 |

| No. | UPPER ELECTRODE DRAWING PORTION WIDTH (μm) w5 | DRAWING LENGTH (μm) L | DISPLACEMENT AMOUNT PIEZOELECTRIC DISPLACEMENT $\Delta z$ (nm) a1 | STRESS MAXIMUM VALUE DRAWING PZT 15 V (MPa) a2 | STRESS MAXIMUM VALUE DRAWING ELECTRODE 15 V (MPa) a3 |
|---|---|---|---|---|---|
| 1 (CONVENTIONAL EXAMPLE) | 5 | 0 | 233 | 241 | 129 |
| 2 | 5 | 40 | 266 | 0 | 345 |
| 3 | 5 | 80 | 266 | 0 | 202 |
| 4 | 5 | 130 | 266 | 0 | 162 |
| 5 | 5 | 180 | 266 | 0 | 134 |
| 6 | 5 | 230 | 267 | 0 | 90 |

The invention claimed is:

1. A piezoelectric actuator that deforms a diaphragm provided on a pressure chamber formed in a substrate toward the pressure chamber,
wherein, in a state where the diaphragm is located on the pressure chamber,
a lower electrode, a piezoelectric member and an upper electrode are sequentially stacked on the diaphragm,
on a part of the piezoelectric member above a side wall of the pressure chamber, an upper electrode drawing portion drawn out from the upper electrode above the pressure chamber is formed,
under the upper electrode drawing portion, the piezoelectric member is separated by a gap portion above a boundary surface between the side wall of the pressure chamber and the pressure chamber in the substrate, and
the upper electrode drawing portion on the gap portion is formed to be bent within a plane parallel to a stacking surface of the upper electrode.

2. The piezoelectric actuator of claim 1,
wherein a width of the upper electrode drawing portion on the gap portion is twice or less an amount of side etching when the piezoelectric member is subjected to patterning.

3. A piezoelectric actuator that deforms a diaphragm provided on a pressure chamber formed in a substrate toward the pressure chamber,
wherein, in a state where the diaphragm is located on the pressure chamber,
a lower electrode, a piezoelectric member and an upper electrode are sequentially stacked on the diaphragm,
on a part of the piezoelectric member above a side wall of the pressure chamber, an upper electrode drawing portion drawn out from the upper electrode above the pressure chamber is formed,
under the upper electrode drawing portion, the piezoelectric member is separated by a gap portion above a boundary surface between the side wall of the pressure chamber and the pressure chamber in the substrate, and
the upper electrode drawing portion on the gap portion is formed to be bent into the gap portion in an initial state before displacement of the piezoelectric member.

4. The piezoelectric actuator of claim 1,
wherein the piezoelectric member is separated by the gap portion into a first piezoelectric member located above the pressure chamber and a second piezoelectric member formed above the side wall of the pressure chamber so as to surround the first piezoelectric member, and
the upper electrode drawing portion is formed by drawing out the upper electrode above the pressure chamber from positions symmetric with respect to a center of the pressure chamber over the gap portion in directions opposite to each other.

5. A piezoelectric actuator that deforms a diaphragm provided on a pressure chamber formed in a substrate toward the pressure chamber,
wherein, in a state where the diaphragm is located on the pressure chamber,
a lower electrode, a piezoelectric member and an upper electrode are sequentially stacked on the diaphragm,
on a part of the piezoelectric member above a side wall of the pressure chamber, an upper electrode drawing portion drawn out from the upper electrode above the pressure chamber is formed, under the upper electrode drawing portion, the piezoelectric member is separated by a gap portion above a boundary surface between the side wall of the pressure chamber and the pressure chamber in the substrate, when in the upper electrode above the pressure chamber, end portions on sides opposite to each other are a first end portion and a second end portion, respectively, and the upper electrode drawing portion is drawn from the first end portion of the upper electrode above the pressure chamber through an outside of the piezoelectric member above the pressure chamber to a side of the second end portion, is then further extended in a direction opposite to the first end portion and is drawn out onto the piezoelectric member above the side wall of the pressure chamber.

6. An ink-jet head comprising:
the piezoelectric actuator of claim 1; and
a nozzle plate that includes a discharge outlet for an ink with which the pressure chamber of the piezoelectric actuator is filled.

7. The piezoelectric actuator of claim 3,
wherein a width of the upper electrode drawing portion on the gap portion is twice or less an amount of side etching when the piezoelectric member is subjected to patterning.

8. The piezoelectric actuator of claim 5,
wherein a width of the upper electrode drawing portion on the gap portion is twice or less an amount of side etching when the piezoelectric member is subjected to patterning.

9. The piezoelectric actuator of claim 3,
wherein the piezoelectric member is separated by the gap portion into a first piezoelectric member located above the pressure chamber and a second piezoelectric member formed above the side wall of the pressure chamber so as to surround the first piezoelectric member, and
the upper electrode drawing portion is formed by drawing out the upper electrode above the pressure chamber from positions symmetric with respect to a center of the pressure chamber over the gap portion in directions opposite to each other.

10. An ink-jet head comprising:
the piezoelectric actuator of claim 3; and
a nozzle plate that includes a discharge outlet for an ink with which the pressure chamber of the piezoelectric actuator is filled.

11. An ink-jet head comprising:
the piezoelectric actuator of claim 5; and
a nozzle plate that includes a discharge outlet for an ink with which the pressure chamber of the piezoelectric actuator is filled.

\* \* \* \* \*